United States Patent [19]

Iwasaki

[11] Patent Number: 5,552,632
[45] Date of Patent: Sep. 3, 1996

[54] PLATE-SHAPED EXTERNAL STORAGE DEVICE AND METHOD OF PRODUCING THE SAME

[75] Inventor: Hiroshi Iwasaki, Yokohama, Japan

[73] Assignee: Kabushiki Kaisha Toshiba, Kanagawa-ken, Japan

[21] Appl. No.: 205,452

[22] Filed: Mar. 4, 1994

[30] Foreign Application Priority Data

Apr. 28, 1993 [JP] Japan ................................. 5-102884

[51] Int. Cl.⁶ .......................... H01L 23/02; H01L 23/48; H01L 23/04
[52] U.S. Cl. .......................... 257/679; 257/690; 257/693; 257/698
[58] Field of Search .................................. 257/679, 698, 257/693, 690, 727, 730; 365/218

[56] References Cited

U.S. PATENT DOCUMENTS 5,309,402  5/1994  Okazawa .......................... 365/218

FOREIGN PATENT DOCUMENTS

| 0338080A1 | 8/1988 | European Pat. Off. | 257/679 |
|---|---|---|---|
| 2-359-464 | 1/1978 | France | 257/693 |
| 63-239094 | 10/1988 | Japan | 257/693 |
| 2-22849 | 1/1990 | Japan | 257/690 |
| 3-109755 | 5/1991 | Japan | 257/696 |
| 5-183094 | 7/1993 | Japan | 257/690 |

OTHER PUBLICATIONS

European Search Report for Application No. 94301681.6 dated Jun. 29, 1994 with English Abstract.

*Primary Examiner*—Steven H. Loke
*Attorney, Agent, or Firm*—Finnegan, Henderson, Farabow, Garrett & Dunner, L.L.P.

[57] ABSTRACT

An external storage device includes a storage medium series element containing at least a non-volatile memory device and external connection terminals connected to input/output terminals of the storage medium series element. An insulator molds the series element and terminals into a plate to form a plate-shaped external storage device. The terminals may be exposed in concavities or in a plane on a peripheral surface of the external storage device.

22 Claims, 5 Drawing Sheets

PLATE-SHAPED EXTERNAL STORAGE DEVICE AND METHOD OF PRODUCING THE SAME

BACKGROUND OF THE INVENTION

1. Field of the Invention

The invention relates to external storage devices capable of recording and saving various data, a method of producing the external storage devices, an external storage device unit. More specifically, the invention relates to an external storage device exchangeably used for storage equipment and devices as an external storage medium, a method of readily producing the external storage device, and an effective utilization of the external storage device.

2. Description of the Related Art

Storage devices or memory elements, which are capable of recording and saving various data, have been utilized in two systems. In one system they are incorporated and fixed within storage equipment or devices, and in the other system they are releasably or exchangeably incorporated in the storage equipment or devices. For the external storage devices they may optionally be attached or detached or freely removed from the storage equipment or devices, for example, floppy disk devices can be attached and detached by one touch operation. Therefore, when floppy disks are the recording mediums they can separately be used, depending on the purpose and object, to record and save the data, whereby easier data reduction can advantageously be obtained.

However, a problem arises in the floppy disks described above, when the data occasionally disappears during data recording or saving producing less reliability in addition to slower access time. In addition when producing smaller sized floppy disks in response to a miniaturization policy, a storing area of the storage medium is correspondingly smaller to reduce storage capacity, this thus limits practical use thereof.

On the other hand, semiconductor memory devices used as external storage device such as IC memory cards can overcome the drawbacks in floppy disks, because they generally exhibit graded reliability of data recording and saving and relatively rapid access time.

The IC memory cards comprise, a functional circuit in which circuit components containing the semiconductor memory devices or elements are mounted on substrates, a resin casing attached therein with the functional circuit as an inside attachment, a cover for coating and sealing both opening surfaces of the resin casing, and external connection terminals such as two piece connectors which are attached on one edge of the resin casing and electrically connect the functional circuit and the storage equipment/device. However, IC memory cards are assembled with a large amount of components and parts, where a relatively complicated structure is required with limitation to a thickness of the IC memory card. Further, disadvantages arise as a result of lower cost performance or production yields on mass production in addition to the lower releasability for the storage equipment/devices or fluctuated releasability on function.

SUMMARY OF THE INVENTION

An object of the invention is to provide an external storage device formed by a simplified process.

Another object of the invention is to provide an external storage device having a high releasability with a high reliable function as an external storage medium.

Further, another object of the invention is to provide a method of producing a highly reliable external storage device with graded production yields.

Still another object of the invention is to provide an external storage device unit formed by a simplified process.

Still further, another object of the invention is to provide an external storage device unit having a high releasability with a reliable superior function as an external storage medium.

An external storage device according to the present invention is characterized by comprising, an external storage device molded into a plate shape or a card shape through coating and sealing a storage medium series element containing at least a non-volatile semiconductor memory device by using insulator, and external connection terminals connected to input/output terminals of the storage medium series element coated, incorporated by the insulator and led and exposed in a concaved or plane manner on a peripheral surface of the external storage device main.

An external storage device unit according to the invention is characterized by comprising:

an external storage device formed into a plate shape through unitarily coating and sealing the storage medium series element containing at least a non-volatile semiconductor memory device by insulator, and an external storage device having external connection terminals connected to the input/output terminals of the storage medium series element coated and incorporated unitarily by the insulator and led and exposed in concaved manner on a peripheral surface of the external storage device main; and an external storage device unit including, an engaging section contacted and engaged with a concaved surface led and exposed of at least the external connection terminals of the external storage device, and a connection section having electric contacts which are arranged on a mated contact surface of the engaging section and which are resiliently connected and disconnected from the external connection terminals depending on engaging, attaching and detaching of the external storage device for the engaging section.

Alternatively, an external storage device unit according to the invention includes:

an external storage device formed of, an external storage device main molded into a plate shape through unitarily coating and sealing an external medium series element containing at least a non-volatile semiconductor memory device by an insulator, and external connection terminals which are connected to input/output terminals of the storage medium series element coated and incorporated by the insulator and which are led and exposed on a peripheral surface of the external storage device main; and an external storage device unit main including an engaging section engaged and contacted with a surface led and exposed of at least the external connection terminals of the external storage device, a connection section having electric contacts which are arranged on a mated contact surface of the engaging section and which are resiliently connected or disconnect from the external connection terminals depending on engaging, attaching, or detaching of the external storage device to the engaging section, and a circuit having a control circuit and an interface circuit for the external storage device to be engaged, attached and detached. Here, the external storage device unit main may preferable be formed into a card shape.

A method of producing an external storage device according to the invention is characterized by comprising the steps of: process in which an external medium series element containing at least a non-volatile semiconductor memory device electrically connected with concaved type external connection terminals led outside is arranged in a splitting and assembling type mold provided on its inside walls with protruded shaped terminal protrusions respectively in corresponding to the external connection terminals led outside in way that the external connection terminals and the protruded shaped terminal protrusions opposing each other are registered;

process in which sealing resin is injected into mold arranged and registered of the storage medium series element and both the storage medium series element and the concaved type external connection terminals led outside are coated and sealed unitarily by insulative resin to be formed into a plate shape; and process in which after molding by the mold, mold pieces of splitting and assembling type are allowed to separate from a plate shaped mold state.

The present invention has cleverly been conceived in that a semiconductor memory device or element is mounted on the conventional substrate, on the other hand, the invention has been achieved in view of the fact that, when a NAND type flash memory device or element (NAND type flash E²ROM) comes to have a higher integration than DRAM (dynamic random access memory) with a capacity of 16 M-bits per chip, it can correspond to 2 M-bytes of floppy disk. In the structure of the external storage device with a plate shape or a card shape according to the invention, a part or entire of the control circuit components such as semiconductor elements forming a control function in addition to the non-volatile semiconductor memory device exhibiting a memory function, are incorporated into the plate shaped or card type external storage device to produce a build-in type.

In the external storage device according to the invention, first, a memory capacity of an extent of 16 M-bits per chip can be obtained because of a high integration, thereby the non-volatile semiconductor memory device is used as a main memory without requiring a power supply for maintaining the storage. Secondly, the main memory is made into unitary forms, the plate shape or the card type by insulative resin etc. This mold type readily provides easier handling, simplified structure in a thin shape, resulting in lower cost. In addition, the external connection terminals are provided in concaved or flat shapes to enable the mold structure of the external storage device to maintain and exhibit higher releasability for the storage equipment/device and to raise a reliability of electrical connection or disconnection due to attaching or detaching operation.

DESCRIPTION OF THE PREFERRED EMBODIMENTS

Embodiment 1

Figure 1:
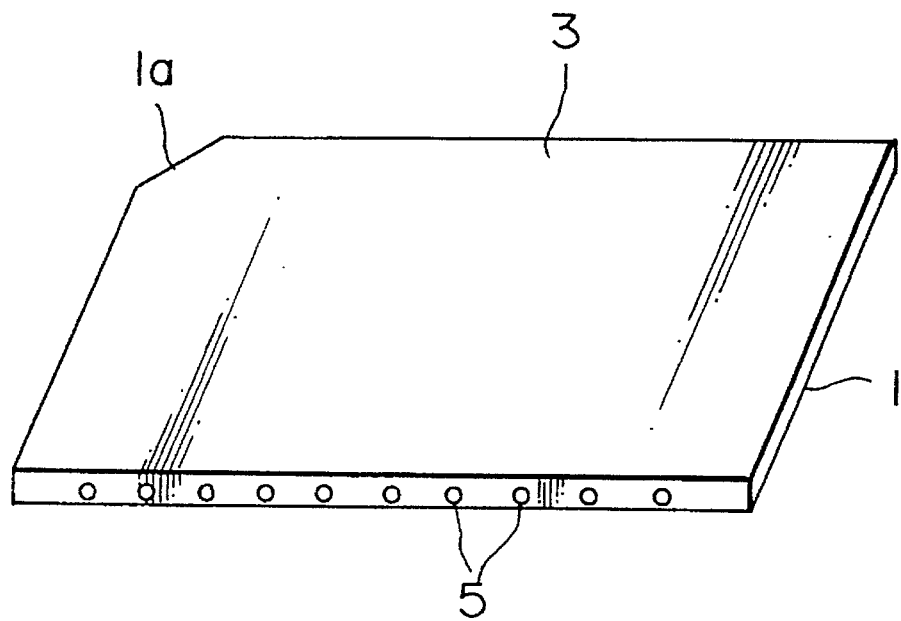
FIG. 1 is a perspective view showing essentials of an example of an external storage device according to the invention.
Figure 2:
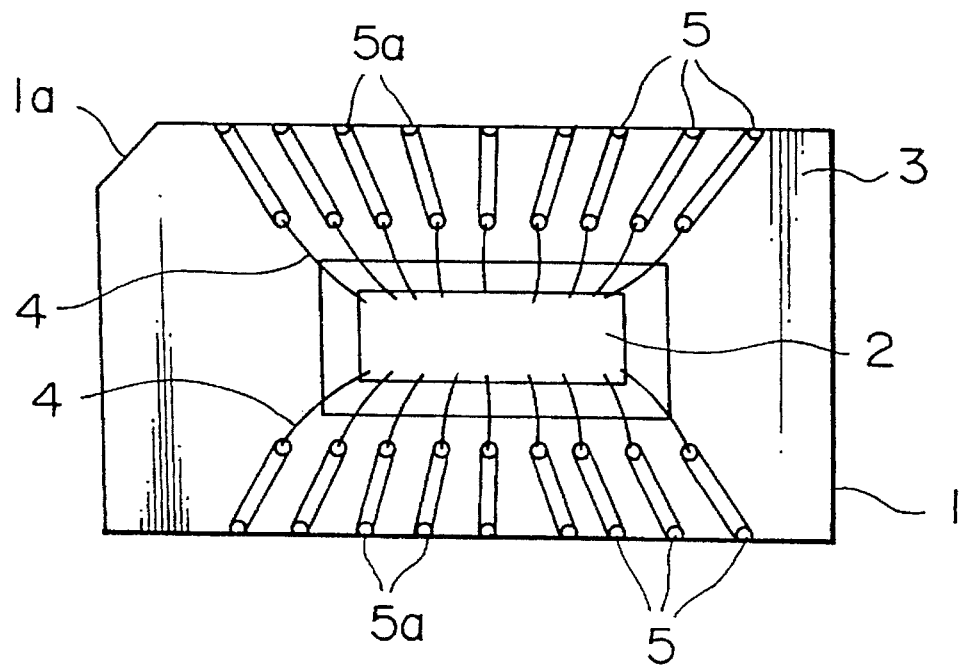
FIG. 2 is a perspective line plan view showing essentials of an example of an external storage device according to the invention.

FIG. 1 is a perspective illustration of an outline of an example of an external storage device according to the invention, and FIG. 2 is a perspective line plan view of an outline of an example of an external storage device according to the invention. In this embodiment, an external storage device 1 is configured in that a NAND type flash memory device 2 is made up on a frame substrate by a wire bonding method to produce a main body thereof sized with a length of 40 mm and a width of about 30 mm. The external storage device main is formed into a thin plate shape, coated, and mold sealed by a generally used semiconductor element molding resin such as epoxy based resin or the like. The NAND type flash memory device 2 may be bonded by a TAB (Tape Automated Bonding) system. In this embodiment, on input/output portions of the NAND type flash memory device 2, recessed external connection terminals 5 are electrically connected by a wire bonding 4 these terminals 5 are led and exposed, in a manner of slightly formed recessed surfaces 5a, on end surfaces of opposing edges in the thin plate shape by the coating and sealing.

Figure 3:
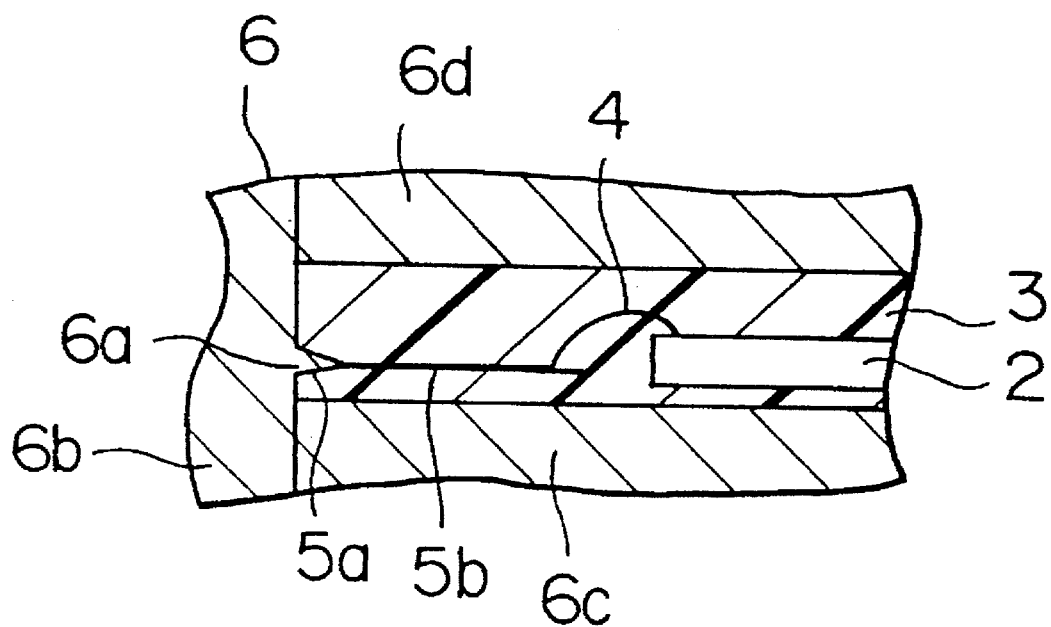
FIG. 3 is a schematic sectional view showing essentials of a preferred embodiment in producing an external storage device according to the invention.
Figure 4:
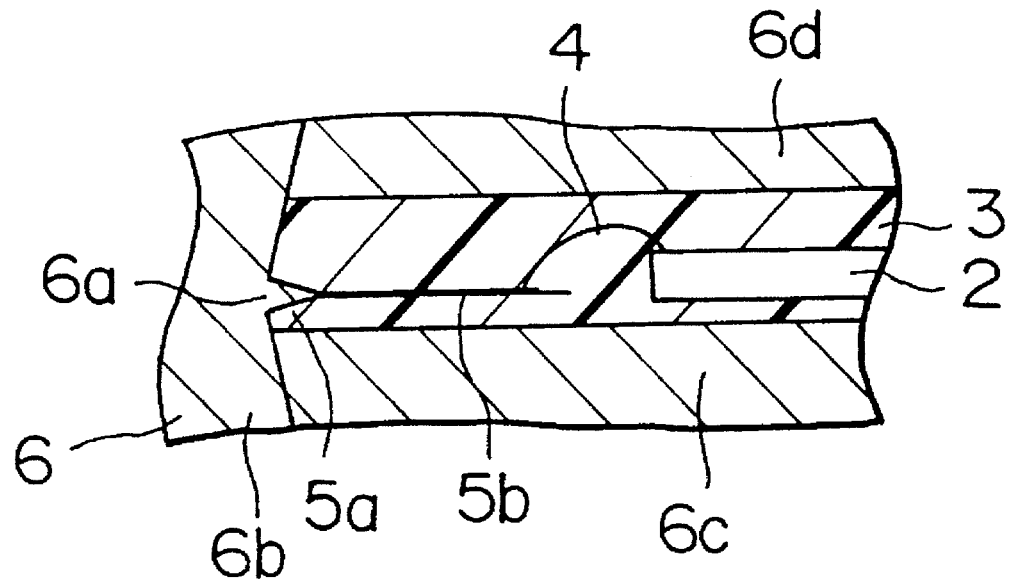
FIG. 4 is a schematic sectional view showing essentials of another preferred embodiment in producing an external storage device according to the invention.

In a method of producing the external storage device, FIGS. 3 and 4 are sectional views schematically showing a preferred embodiment of a method of producing the external storage device. First, the control proceeds to prepare the NAND type flash memory device 2 to be provided with the required external connection terminals 5. An example of this NAND type flash memory device 2 to be prepared is of a NAND type. The device 2 is assembled in that the recessed shaped external connection terminals 5 are electrically connected and led outside by a wire bonding system. The NAND type flash memory device 2 is attached on a metallic frame (not shown) and may preferably be fixed tentatively with a lead 5b which is led outside. On the other hand, the control proceeds to prepare for a disassemble type mold provided on its predetermined inside-walls with a protruded terminal shaped protrusion 6a mated with a recessed surface 5a of each recessed shaped external connection terminal 5 which is led outside, with respect to the NAND type flash memory device 2. The mold 6 is formed into a disassemble type and includes a side wall 6b formed by combining squared side-walls, a bottom wall 6c engaging and sealing squared top and bottom openings formed from the side walls 6b, and a top wall 6d. A pair of side walls 6b they oppose each other from among the side walls 6b are arranged with a group of terminal shaped protrusions 6a opposing each other for corresponding to the recessed surfaces 5a of the external connection terminals 5 of the NAND type flash memory device 2.

The disassemble type mold 6 registers, engages, and arranges the external connection terminals 5 of the NAND type flash memory device 2 with the corresponding terminal shaped protrusions 6a of the mold 6. Then if required, the NAND type flash memory device 2 is floated and positioned through supporting pieces (not shown) for the bottom walls 6c of the mold 6. A concrete example thereof includes supporting both a frame section for loading the NAND type flash memory device 2 and the external connection terminals 5 on the mold 6 by using thin frame bars. In this way, after positioning and arranging the NAND type flash memory device 2 within the mold 6, the control proceeds to inject sealing resin 3, such as epoxy resin, to coat and seal the NAND type flash memory device 2 together with the recessed shaped external connection terminals 5 in unitary shape with the insulative resin 3, and form a plate shape. Thereafter, the walls or mold pieces 6b, 6c, and 6d of the assembled and formed mold 6 are separated from each other and from the plate shaped mold to produce the external storage device as shown in FIGS. 1 and 2.

In FIGS. 1 and 2, numeral 1a depicts a mark for indicating direction of the external storage device 1, showing the mechanical attaching and connection for the storage equipment/device and preventing or avoiding erroneous attaching. The mark 1a showing directionality is not limited to a corner section or one corner, but it may preferably be set to simultaneously provide a guide function in a detachable structure of the equipment/devices. A connection for the external connection terminals 5 of the external storage device 1 may preferable be non-contact connection systems such as radio waves or lights in addition to mechanical connections.

Embodiment 2

Figure 5:
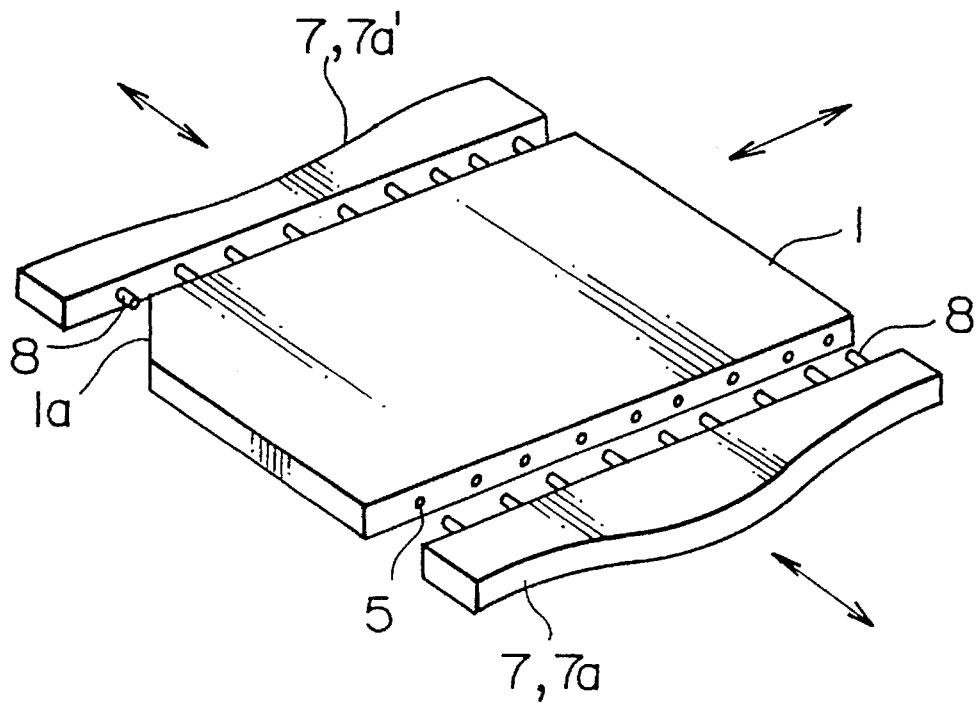
FIG. 5 is a perspective view showing a broken down example of an outline of an external storage device unit according to the invention.
Figure 6:
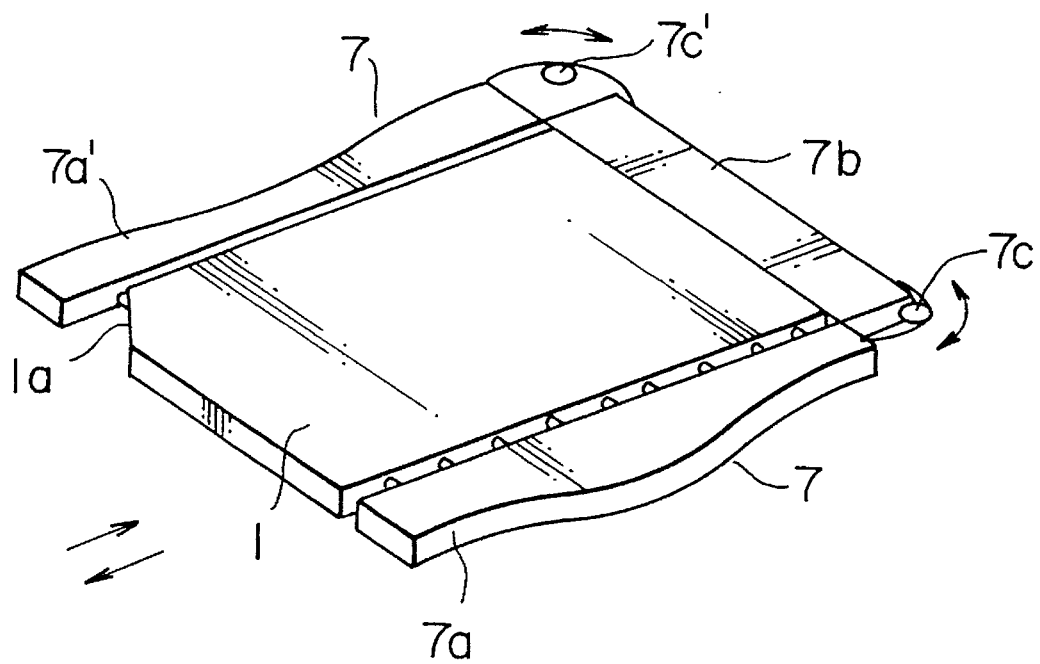
FIG. 6 is a perspective view showing a broken down example of essentials of an external storage device unit according to the invention.
Figure 7:
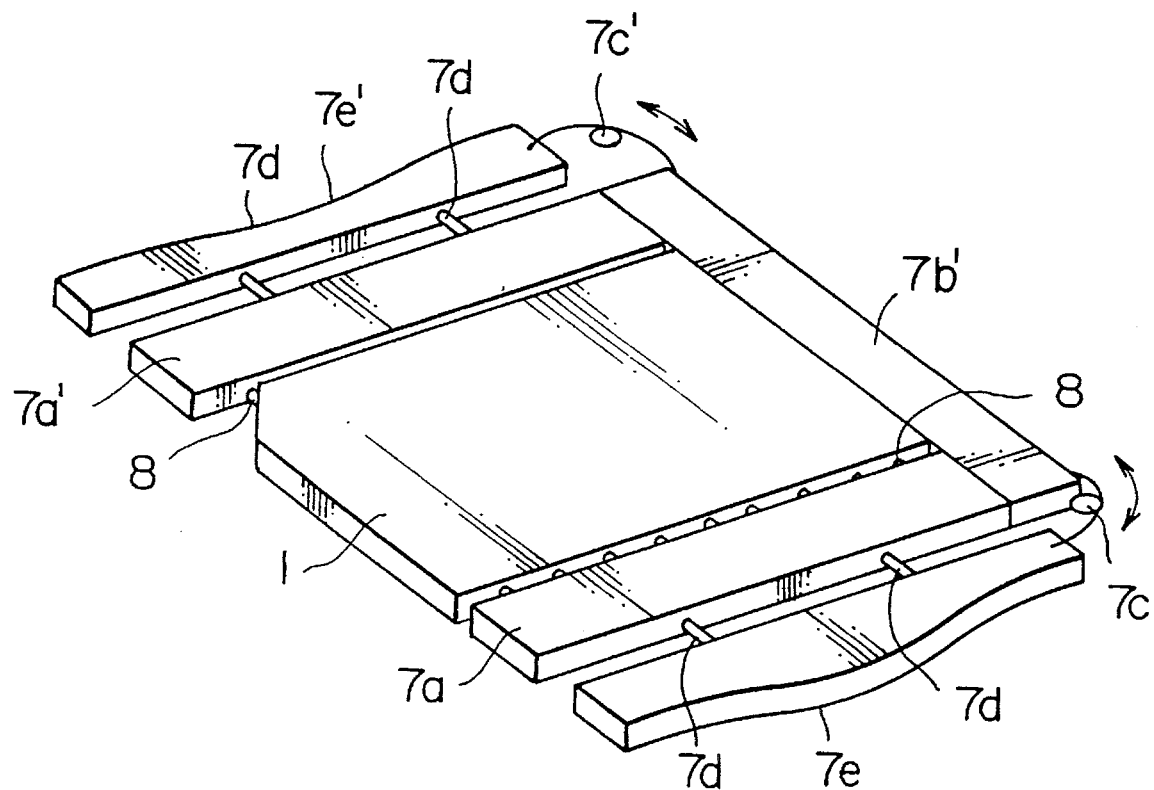
FIG. 7 is a perspective view showing a broken down example of essentials of another external storage device unit according to the invention.

FIGS. 5 to 7 are perspective views showing outlines of structures together with operation modes of an external storage device unit according to the invention. In this example, the external storage device 1 formed as described above in the embodiment 1 is in a condition of having a one-side constituent element. The storage medium series element containing at least the non-volatile semiconductor memory chip 2 is coated and sealed by the insulator 3, such as epoxy resin, to be connected with the input/output terminals of both the card shape molded external storage device and the storage medium series element coated and incorporated by the insulator 3. This produces the external storage device 1 having external connection terminals 5 exposed in the manner of a concaved surface on a periphery end surface of the external storage device main, where such external storage device 1 is premised on this embodiment. As shown in FIG. 5, when inserting or extracting the external storage device 1 in or from the engage type unit 7 of the storage equipment/device main by one touch operation, depending on such insertion or extraction, the external connection terminal 5 led and exposed on opposing edges is resiliently connected to or disconnected from an electric contact 8 arranged on an engaging section of the engaging unit 7.

FIG. 6 shows in detail a structural example of the engaging unit 7, where opposing surfaces of a pair of supporters 7a and 7a', arranged to oppose each other, are engaged with end surfaces from the external connection terminals 5 of the external storage device 1 to produce a slidable form. Electric contacts 8 corresponding to the external connection terminals 5 of the external storage device 1 are electrically and insulatively arranged on a slidably formed region on the opposing surfaces of the supporters 7a and 7a'. These electric contacts 8 are electrically connected to the main body-side of the storage equipment/device and form the necessary electric circuit.

Numeral 7b depicts a slide stop member of the external storage device 1 for sliding the opposing surfaces of the pair of supporters 7a and 7a'. When the external storage device 1 is inserted and tip end thereof contacts the slide stop member 7b, pin type springs 7c and 7c' rotate in opposite directions by pressure due to such contact. By the rotation of the pin type springs 7c and 7c', the electric contacts 8 arranged on the opposing surfaces of the supporters 7a and 7a' contact with corresponding external connection terminals 5 of the thus inserted external storage device 1 to achieve necessary electrical connection. Here, an automatic fixing and setting are completed by inserting the external storage device 1 into the engaging unit 7 to attach it in a predetermined position. Depressing a push button (not shown) arranged on a main body of the unit provides for release of a fixed engaging piece (not shown) and extraction of the external storage device 1. On releasing the fixed engaging piece, the external storage device 1 is automatically extracted by the reverse rotation of the pin type springs 7c and 7c' and the contacts of the external connection terminals 5 and the electric contacts 8 are released.

According to the invention, the engaging unit 7 is formed as developmentally shown in FIG. 7, where the pair of supporters 7a and 7a' may preferable be arranged to be movable in opposite direction through a resilient type springs 7d by a pair of cylinders 7e and 7e' respectively. Even in this structure, the electric contacts 8, which correspond to the external connection terminals 5 led and exposed on opposing end surfaces of the external storage device 1, are electrically insulated with each other and arranged on opposing surfaces of the supporters 7a and 7a'. Of course, these electric contacts 8 are electrically connected to the storage equipment/device main body side and form the necessary electric circuit. Numeral 7b' depicts an insertion stop member when the external storage device 1 is inserted. When the external storage device 1 is inserted to contact the external storage device 1 with the insertion stop member 7b', pressure of this contact rotates the resilient type springs 7c and 7c' reverse to an energizing direction. This rotation forwards the supporters 7a and 7a' in opposite directions to press and contact the electric contacts 8 to the corresponding external connection terminals 5 of the thus inserted external storage device 1 to achieve the required electric connection. On the other hand, when extracting the external storage device 1, the pin type springs 7c and 7c' are reversally rotated, and it is correspondingly pushed out. As is the case shown in FIG. 6, the external storage device 1 is inserted into the engaging unit 7 and attached in a predetermined position, then an automatic fixed setting is performed. On releasing the fixed setting, it is automatically pushed out by the reverse rotation of the pin type springs 7c and 7c', and the contacts of both the external connection terminals 5 and the electric contacts 8 are released.

Embodiment 3

Figure 8:
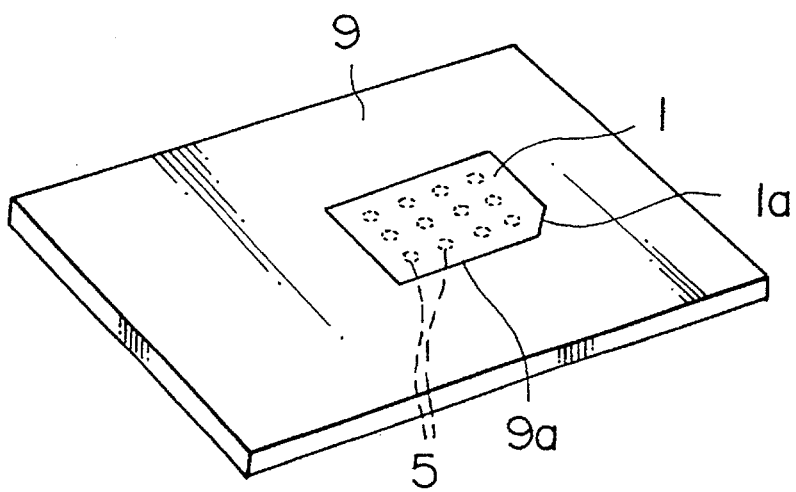
FIG. 8 is a perspective view showing an example of a different structure of an external storage device unit according to the invention.
Figure 9:
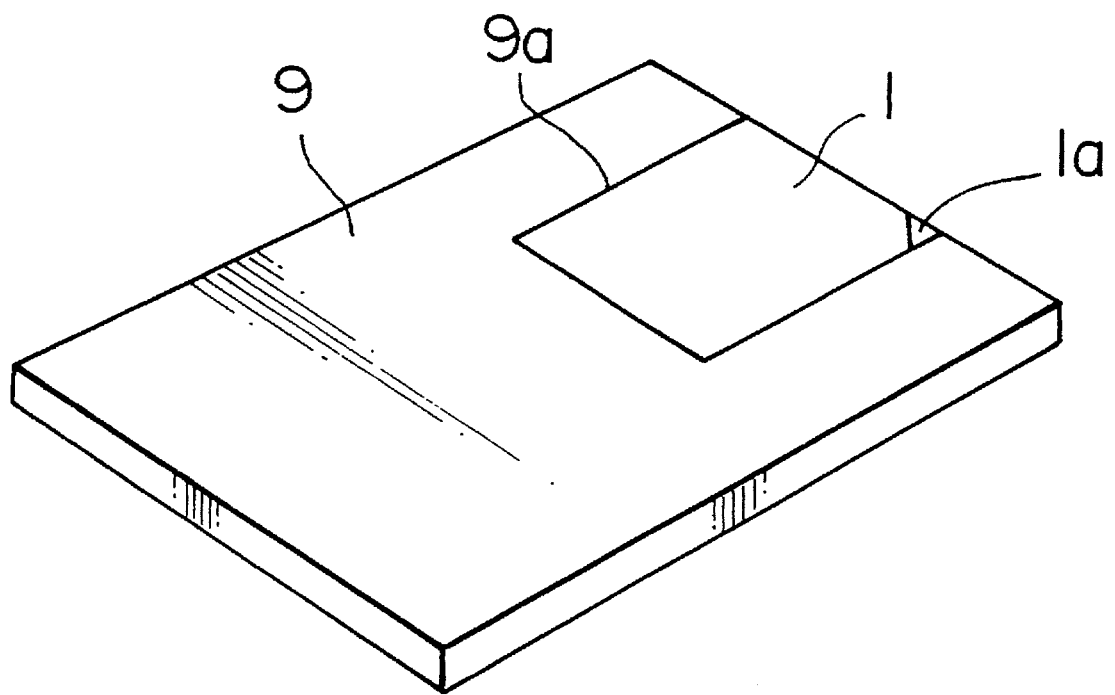
FIG. 9 is a perspective view showing an example of a further another structure of an external storage device unit according to the invention.

FIGS. 8 and 9 are perspective views showing different examples of external storage device units according to the invention respectively. In the drawings, the external storage device 1 constructed as follows is in a one-side constituent element. The storage medium series element containing at least a non-volatile semiconductor memory chip is coated and sealed by an insulator, to be connected with input/output terminals of both an external storage device main formed in a card shape and a storage medium series element incorporated with coating of the insulator. This produces an external storage device 1 having external connection terminals 5 led and exposed in a manner of a concaved or plane shape on the peripheral end surface or the main surface of the external storage device main, where such external storage device 1 is premised on this embodiment. The external storage device 1, as shown in FIGS. 8 and 9, can optionally be attached or detached to or from an external storage device unit main 9 provided with a region or window 9a capable of attaching and detaching the external storage device 1. The external storage device unit main 9 including a control device for the external storage device 1 is combined with a connection section formed of electric contacts for resiliently connecting or disconnecting to or from the external connection terminals 5 depending on whether the external storage device 1 is attached or detached to or from the region 9a. The region 9a is a window forming an engaging/attaching section and is to be detachable from the external storage device 1. As in the other embodiments described, the external storage device 1 is engaged, attached and detached by one touch operation to and form the engaging/attaching section or region 9a of the external storage device unit main 9 to produce the required functions such as recording etc.

In the structure in FIG. 8, the electric contacts 8 corresponding to the external connection terminals 5 of the external storage device 1 are resiliently provided on the engaging/attaching section 9a of the external storage device unit main 9. On engaging, attaching and setting the external storage device 1, a pressure force thereof allows the electric contacts 8 to resiliently contact with the external connection terminals 5 led and exposed in a plane manner on the main surface (backside surface) of the external storage device 1, and such re-added pressure resets the external storage device 1. Upon detachment the electric contacts 8 are simultaneously resiliently detached from the external connection terminals 5.

In FIG. 9, when the external storage device 1 is engaged, attached, and set on the engaging/attaching section 9a of the external storage device unit main 9, the external connection terminals 5, which are placed on the end surface in the attaching or inserting direction, resiliently contact with the electric contacts 8 arranged on a contact surface of the engaging/attaching section 9a. Preferably, the electric contacts 8 are resiliently provided on the side connection section. On resetting to engage or attach the external storage device 1, engaging or hooking is released and this allows the electric contacts 8 to detach from the external connection terminals 5. If the external storage device unit main is formed into a card shape, then preferably, the external storage device unit is easy to carry as a set. The conventional card type external storage device, so called an IC memory card functions as one IC memory card such that pin connections are loaded in accordance with JEIDA (Japanese Electric Industry Development Association) or PCMCIA (Personal Computer Memory Card International Association), or the other semiconductor devices such as interface circuits or semiconductor memory control circuits or switching circuits are loaded on the substrate. On the contrary, in the present invention only the semiconductor memory is optionally separated and used, this therefore provides a great advantage.

Preferably, the connecting section of the above embodiments includes a circuit having a memory circuit, an interface circuit, and a switching circuit for the external storage device 1.

It is understood that the invention is not limited to the embodiments as described above and in the foregoing. Various changes may be made therein without departing from the subject matter of the invention.

As hereinbefore fully described, in the external storage device and the external storage device unit according to the invention, various advantages are provided as listed below. For the external storage device, a high integration is provided, where the non-volatile semiconductor memory device having a larger memory capacity even in one compact chip is used as a main memory, which is molded unitarily into a card shape by insulative resin etc. Such use of the unitary mold type and the non-volatile semiconductor memory device readily provides optional detaching, easier carrying, easier handling, and thin compact structure, and thus resulting in lower cost performance. In the unitary form thereof, since the external connection terminals are made into a concaved surface or a flat surface without protruding from the coated or sealed resin layer surface, an upgraded slidability is obtained, this eliminates damage and erroneous connection of the external connection terminals.

The external storage device unit also exhibits graded releasability and improved reliability in function. In particular, various advantages in practical use of the external storage device unit include optional detaching of the external storage device, easier carrying without the possibility of damage from the outside, and a larger recording/saving capacity of the data even in a compact size.

What is claimed is:

1. An external storage device unit comprising:

a plate-shaped external storage device including:

a non-volatile semiconductor memory device including input/output terminals, external connection terminals connected to the input/output terminals, the external connection terminals having end surfaces, and an insulator coating and sealing the memory device and the external connection terminals unitarily into a molded plate to form a plate-shaped external storage device, the end surfaces of the external connection terminals being exposed in concavities on a peripheral surface of the plate-shaped external storage device; and a connection section including:

an engaging section disposed opposite from the peripheral surface of the plate-shaped external storage device for attachment and detachment to and from the external storage device, the engaging section mating and contacting with the end surfaces of the external connection terminals of the external storage device, and electric contacts on a surface of the engaging section for resilient connection to and disconnection from the external connection terminals, depending on whether the engaging section attaches or detaches with the external storage device.

2. An external storage device unit as claimed in claim 1, wherein the non-volatile semiconductor memory device is a NAND type flash memory device.

3. An external storage device unit as claimed in claim 1, wherein the insulator is epoxy resin.

4. An external storage device unit as claimed in claim 1, wherein the engaging section has a plate-shape having a side surface and a main surface.

5. An external storage device unit as claimed in claim 4, wherein the electric contacts are resiliently provided on the side surface of the engaging section, and wherein the peripheral surface is the side surface of the plate-shaped external storage device so that the external connection terminals electrically connect with the electric contacts.

6. An external storage device unit as claimed in claim 4, wherein the electric contacts are resiliently provided on the main surface of the engaging section, and wherein the peripheral surface is the main surface of the plate-shaped external storage device so that the external connection terminals electrically connect with the electric contacts.

7. An external storage device unit comprising:
a plate-shaped external storage device including:
a non-volatile semiconductor memory device including input/output terminals,
external connection terminals connected to the input/output terminals, the external connection terminals having end surfaces, and
an insulator coating and sealing the memory device and the external connection terminals unitarily into a molded plate to form a plate-shaped external storage device, the end surfaces of the external connection terminals being exposed in a plane on a peripheral surface of the plate-shaped external storage device; and
a connection section including:
an engaging section disposed opposite from the peripheral surface of the plate-shaped external storage device for attachment and detachment to and from the external storage device, the engaging section mating and contacting with the end surfaces of the external connection terminals of the external storage device, and
electric contacts arranged on a surface of the engaging section for resilient connection to and disconnection from the external connection terminals depending on whether the engaging section attaches or detaches with the external storage device.

8. An external storage device unit as claimed in claim 7, wherein the non-volatile semiconductor memory device is a NAND type flash memory device.

9. An external storage device unit as claimed in claim 7, wherein the insulator is epoxy resin.

10. An external storage device unit as claimed in claim 7, wherein the engaging section has a plate shape having a side surface and a main surface.

11. An external storage device unit as claimed in claim 10, wherein the electric contacts are resiliently provided on the side surface of the engaging section, and wherein the peripheral surface is the side surface of the plate-shaped external storage device so that the external connection terminals electrically connect with the electric contacts.

12. An external storage device unit as claimed in claim 10, wherein the electric contacts are resiliently provided on the main surface of the engaging section, and wherein the peripheral surface is the main surface of the plate-shaped external storage device so that the external connection terminals electrically connect with the electric contacts.

13. An external storage device unit comprising:
a plate-shaped external storage device including:
a non-volatile semiconductor memory device including input/output terminals,
external connection terminals connected to the input/output terminals, the external connection terminals having end surfaces, and
an insulator coating and sealing the memory device and the external connection terminals unitarily into a molded plate to form a plate-shaped external storage device, the end surfaces of the external connection terminals being exposed on a peripheral surface of the plate-shaped external storage device; and
an external storage device unit main including
an engaging section disposed opposite from the peripheral surface of the plate-shaped external storage device for attachment and detachment to and from the external storage device, the engaging section mating and contacting with the end surfaces of the external connection terminals of the external storage device,
electric contacts arranged on a surface of the engaging section for resilient connection to and disconnection from the external connection terminals depending on whether the engaging section attaches or detaches with the external storage device, and
a circuit having a memory control circuit, an interface circuit and a switching circuit for the external storage device.

14. An external storage device unit as claimed in claim 13, wherein the non-volatile semiconductor memory device is a NAND type flash memory device.

15. An external storage device unit as claimed in claim 13, wherein the insulator is epoxy resin.

16. An external storage device unit as claimed in claim 13, wherein the engaging section has a plate shape having a side surface and a main surface.

17. An external storage device unit as claimed in claim 16, wherein the electric contacts are resiliently provided on the side surface of the engaging section, and wherein the peripheral surface is the side surface of the plate-shaped external storage device so that the external connection terminals electrically connect with the electric contacts.

18. An external storage device unit as claimed in claim 17, wherein the end surfaces of the external connection terminals are exposed in concavities on the peripheral surface of the plate-shaped external storage device.

19. An external storage device unit as claimed in claim 17, wherein the end surfaces of the external connection terminals are exposed in a plane on the peripheral surface of the plate-shaped external storage device.

20. An external storage device unit as claimed in claim 16, wherein the electric contacts are resiliently provided on the main surface of the engaging section, and wherein the peripheral surface is the main surface of the plate-shaped external storage device so that the external connection terminals electrically connect with the electric contacts.

21. An external storage device unit as claimed in claim 20, wherein the end surfaces of the external connection terminals are exposed in concavities on the peripheral surface of the plate-shaped external storage device.

22. An external storage device unit as claimed in claim 20, wherein the end surfaces of the external connection terminals are exposed in a plane on the peripheral surface of the plate-shaped external storage device.

* * * * *